(12) United States Patent
Sun et al.

(10) Patent No.: US 7,894,245 B2
(45) Date of Patent: Feb. 22, 2011

(54) SPIN-CURRENT SWITCHABLE MAGNETIC MEMORY ELEMENT AND METHOD OF FABRICATING THE MEMORY ELEMENT

(75) Inventors: Jonathan Zanhong Sun, Shrub Oak, NY (US); Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 11/869,593

(22) Filed: Oct. 9, 2007

(65) Prior Publication Data
US 2008/0025082 A1    Jan. 31, 2008

Related U.S. Application Data

(63) Continuation of application No. 10/990,401, filed on Nov. 18, 2004, now Pat. No. 7,313,013.

(51) Int. Cl.
G11C 11/00    (2006.01)

(52) U.S. Cl. .......... 365/158; 365/171; 365/173

(58) Field of Classification Search .......... 365/158, 365/171, 173
See application file for complete search history.

(56) References Cited

U.S. PATENT DOCUMENTS

| | | | |
|---|---|---|---|
| 4,251,842 A * | 2/1981 | Iwasaki et al. | 360/134 |
| 5,801,984 A | 9/1998 | Parkin | |
| 6,515,341 B2 * | 2/2003 | Engel et al. | 257/421 |
| 6,628,542 B2 | 9/2003 | Hayashi et al. | |
| 6,777,730 B2 | 8/2004 | Daughton et al. | |
| 2001/0014001 A1 * | 8/2001 | Aoshima et al. | 360/327.32 |
| 2003/0048658 A1 | 3/2003 | Chen | |
| 2003/0063491 A1 * | 4/2003 | Ikeda | 365/158 |
| 2003/0077800 A1 * | 4/2003 | Rouleau et al. | 435/196 |
| 2004/0057164 A1 | 3/2004 | Parker et al. | |
| 2004/0188799 A1 * | 9/2004 | Seyyedy et al. | 257/530 |
| 2005/0018478 A1 | 1/2005 | Nagase et al. | |

FOREIGN PATENT DOCUMENTS

CN    1310481 A    8/2001

OTHER PUBLICATIONS

Jiang, Y., Nozaki, T., Abe, S., Ochiai, T., Hlrohata, A., Tezuka, N., and Inomata, K., "Substantial Reduction of Critical Current for Magnetization Switching in an Exchange-biased Spin Valve" May 9, 2004 Nature Publishing Group pp. 1-4.

(Continued)

*Primary Examiner*—Son Dinh
(74) *Attorney, Agent, or Firm*—Stephen C. Kaufman, Esq.; McGinn IP Law Group, PLLC

(57) ABSTRACT

A spin-current switchable magnetic memory element (and method of fabricating the memory element) includes a plurality of magnetic layers having a perpendicular magnetic anisotropy component, at least one of the plurality of magnetic layers including an alloy of a rare-earth metal and a transition metal, and at least one barrier layer formed adjacent to at least one of the plurality of magnetic layers.

21 Claims, 5 Drawing Sheets

OTHER PUBLICATIONS

Jonathan Sun, et al. U.S. Appl. No. 10/715,376 Filing Date: Nov. 19, 2003.

Huai, Yiming, Albert, Frank, Nguyen, Paul, Pakala, Mahendra, and Valet, Thierry "Observation of Spin-Transfer Switching in Deep Submicron-Sized and Low-Resistance Magnetic Tunnel Junctions" Apr. 19, 2004 Applied Physics Letters vol. 84, No. 16 pp. 3118-3120.

Fuchs, C.D., Emley, N. C., Krivorotov, I.N., Braganca, P.M., Ryan, E.M., Kiselev, S.I., Sankey, J.C. Ralph, D.C., Buhrman, R.A., and Kathie, J.A. "Spin-Transfer Effects in Nanoscale Magnetic Tunnel Junctions" Aug. 16, 2004 Applied Physics Letters vol. 85, No. 7 pp. 1205-1207.

Chinese Office Action dated Jun. 19, 2009.

The Delphion Integrated View: INPADOC Record, "http//www.delphion.com/details?pn+CN01310481A", retrieved Jul. 15, 2009.

International Preliminary Report dated Aug. 21, 2008. (Form PCT/IPEA/409)/

Form PCT/IPEA/416, dated Aug. 21, 2008.

* cited by examiner

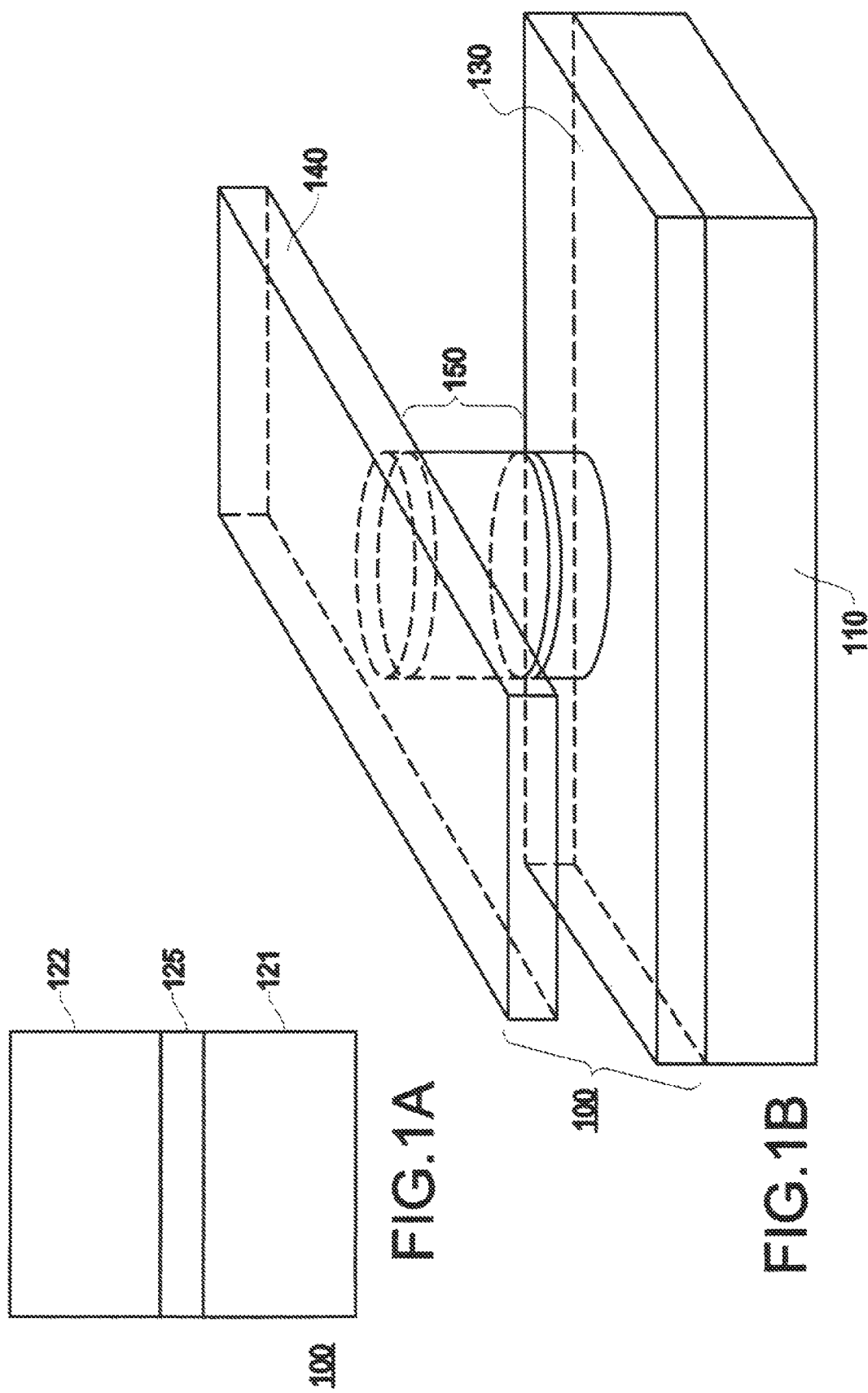

SPIN-CURRENT SWITCHABLE MAGNETIC MEMORY ELEMENT AND METHOD OF FABRICATING THE MEMORY ELEMENT

CROSS-REFERENCE TO RELATED APPLICATIONS

The present application is a Continuation Application of U.S. patent application Ser. No. 10/990,401 filed on Nov. 18, 2004, now U.S. Pat. No. 7,313,013 which is incorporated by reference herein and from which the present Application claims priority.

BACKGROUND OF THE INVENTION

1. Field of the Invention

The present invention relates to a spin-current switchable magnetic memory element and a method of fabricating the memory element, and more particularly, to a spin-current switchable magnetic memory element including a plurality of magnetic layers, at least one of the plurality of magnetic layers including an alloy of a rare-earth metal and a transition metal.

2. Description of the Related Art

A two-terminal, bi-stable resistor that is current-switchable can be used as a memory element. One class of such device is a spin-current switchable magnetic junction (e.g., a tunnel junction or a spin-valve junction). The basic physics of these devices is verified in the past few years. The device holds the promise of being the next generation magnetic memory element for scaling down to junction dimensions of 50 nm and below.

Conventional junction devices that have been experimentally demonstrated require too large a switching current—on the order of mid $10^6$ A/cm$^2$, and the junction impedance is too low, only about 1 to 2$\Omega$-$\mu$m$^2$. Industry-wide efforts are underway to reduce the amount of switching current required, and to increase the device impedance, for effective integration with back-end-of-line (BEOL) CMOS technology.

One method of reducing switching current is by introducing magnetic materials that have a perpendicular magnetic anisotropy. This idea has been quantitatively discussed with respect to related art methods.

A few combinations of materials choices have been previously discussed with respect to related art methods. However, the previously discussed materials choices may tend to require sophisticated thin film synthesis technology such as molecular beam epitaxy.

SUMMARY OF THE INVENTION

In view of the foregoing and other exemplary problems, disadvantages, and drawbacks of the aforementioned systems and methods, it is a purpose of the exemplary aspects of the present invention to provide a spin-current switchable magnetic memory element (e.g., a spin-current injection device) and method of manufacturing the memory element which includes materials that allow the memory element to be manufactured without necessarily requiring sophisticated thin film synthesis technology such as molecular beam epitaxy.

An exemplary aspect of the present invention includes a spin-current switchable magnetic memory element which includes a plurality of magnetic layers having a perpendicular magnetic anisotropy component, at least one of the plurality of magnetic layers comprising an alloy of a rare-earth metal and a transition metal, and at least one barrier layer formed adjacent to at least one of the plurality of magnetic layers. The alloy may include, for example, a GdCo alloy, a TbFeCo alloy, etc.

The plurality of magnetic layers may include a first magnetic layer and a second magnetic layer, the at least one barrier layer being formed between the first and second magnetic layers. At least one of the first and second magnetic layers may include a current-switchable magnetic moment.

Importantly, at least one of the plurality of magnetic layers may be formed by a sputter deposition process. Further, at least one of the plurality of magnetic layers may include a cobalt layer formed on platinum, or a cobalt layer formed on gold. In addition, a thickness of the cobalt layer may be less than about 30 Å.

Further, at least one of the plurality of magnetic layers may include a magnetically free layer which can be rotated by a spin-current injection. In addition, the magnetic layer(s) including the alloy may include a fixed magnetic layer which may have a sufficient thickness and a sufficient magnetic anisotropy to stay fixed during a current-induced switching process. In addition, the magnetic layer(s) the alloy may include a fixed magnetic layer which provides a sufficient amount of spin-polarized current.

Further, the at least one of the plurality of magnetic layers including the alloy may include a thickness of at least 100 Å.

The plurality of magnetic layers may include, for example, a first magnetically fixed layer, a magnetically free layer formed on the first magnetically fixed layer, and a second magnetically fixed layer formed on the magnetically free layer. The at least one barrier layer may include, a first barrier layer formed between the first magnetically fixed layer and the magnetically free layer, and a second barrier layer formed between the magnetically free layer and the second magnetically fixed layer.

The magnetic memory element may also include a first lead formed adjacent to one of the plurality of magnetic layers, a second lead formed adjacent to another one of the plurality of magnetic layers, and a pillar formed between the first and second leads, the pillar including the at least one barrier layer and at least one of the plurality of magnetic layers. The at least one magnetic layer included in the pillar may include the current-switchable magnetic moment. Specifically, the magnetic moment of the at least one magnetic layer included in the pillar may be switchable by an electrical current. In particular, the magnetic moment of the at least one magnetic layer included in the pillar may be switchable by an electrical current having a density of no more than about $10^6$ A/cm$^2$.

Further, the barrier layer preserves spin information for an electric current injected into the pillar and provides a resistance to the current. In addition, at least one of the first and second leads includes a magnetic layer of the plurality of magnetic layers.

The pillar may include, for example, a lithographed pillar having a diameter of less than about 100 nm. The pillar may also have an electrical resistance which depends on a magnetization direction of a lower magnetic layer with respect to a magnetization direction of an upper layer.

The perpendicular magnetic anistropy component magnetic memory element may have a magnitude sufficient to at least substantially offset an easy-plane demagnetization effect, such that a magnetic moment of one of the plurality of magnetic layers is either resting out of the film (e.g., layer) plane or can be rotated out of the film plane under spin current excitation.

Further, the at least one barrier layer may include a plurality of barrier layers which are alternately formed with the plurality of magnetic layers. In addition, the at least one barrier layer may include at least one of an aluminum oxide layer, a magnesium oxide layer, a doped semiconductor layer, a non-magnetic metal layer and a SrTiO$_3$ layer.

Another exemplary aspect of the present invention includes a magnetic memory element, including first and second leads, a pillar formed between the first and second leads, a plurality of magnetic layers having a perpendicular magnetic anisotropy component, at least one of the plurality of magnetic layers comprising an alloy of a rare-earth metal and a transition metal, and at least one barrier layer formed adjacent to at least one of the plurality of magnetic layers.

Another exemplary aspect of the present invention includes a magnetic random access memory (MRAM) array including a plurality of magnetic magnetic memory elements according to at least one of the aspects discussed above.

Another aspect of the present invention includes a method of fabricating a magnetic memory element. The method includes providing a wafer having a bottom electrode, forming a plurality of layers, such that interfaces between the plurality of layers are formed in situ, lithographically defining a pillar structure from the plurality of layers, and forming a top electrode on the pillar structure. The plurality of layers includes a plurality of magnetic layers having a perpendicular magnetic anisotropy component, at least one of the plurality of magnetic layers comprising an alloy of a rare-earth metal and a transition metal, and at least one barrier layer formed adjacent to at least one of the plurality of magnetic layers. The at least one barrier layer may include a plurality of barrier layers which are alternately formed with the plurality of magnetic layers.

With its unique and novel features, the present invention provides a magnetic memory element (e.g., a spin-current injection tunneling device) which includes materials that allow the memory element to be manufactured without necessarily requiring sophisticated thin film synthesis technology such as molecular beam epitaxy.

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIG. 1A-1D illustrate a spin-current switchable magnetic memory element 100, in accordance with an exemplary aspect of the present invention;

Figure 1C:
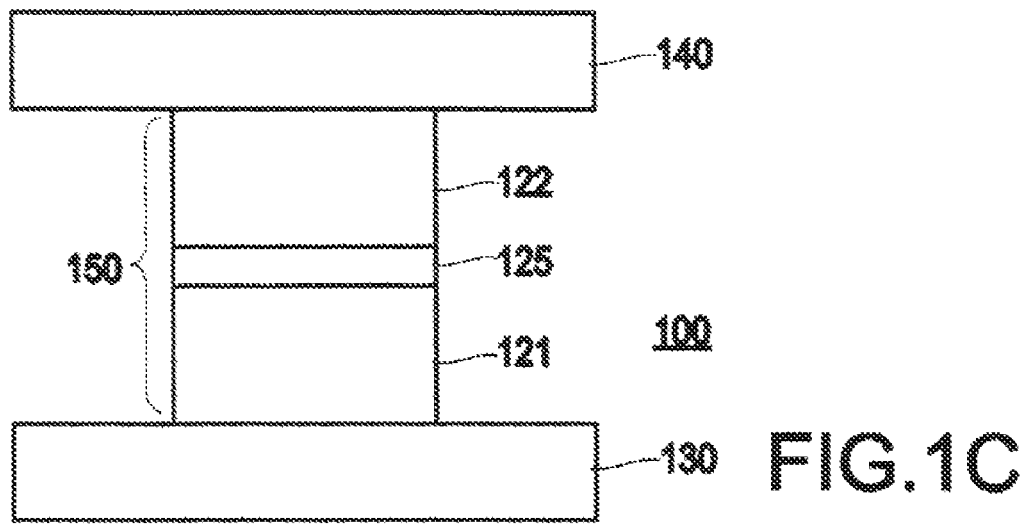

DETAILED DESCRIPTION OF THE
EXEMPLARY EMBODIMENTS OF THE
INVENTION

Referring now to the drawings, FIGS. 1A-1D, 2A-2B, 3A-3C and 4 illustrate an exemplary aspect of the present invention. Specifically, these figures illustrate a magnetic memory element (e.g., a current-switchable two-terminal magnetic memory element) which may be included, for example, as part of a magnetic random access memory (MRAM) array.

In particular, as illustrated in FIG. 1A, an exemplary aspect of the present invention includes a spin-current switchable magnetic memory element 100 which includes a plurality of magnetic layers 121, 122 having a perpendicular magnetic anisotropy component, at least one of the plurality of magnetic layers including an alloy of a rare-earth metal and a transition metal. The memory element 100 further includes at least one barrier layer 125 formed adjacent to at least one of the plurality of magnetic layers 121, 122 (e.g., between two of the magnetic layers).

Generally, the exemplary aspects of the present invention may include one more sets of materials combinations (e.g., magnetic layer material combinations) which are superior in terms of ease in fabrication. An idea of the present invention is to use two different types of perpendicular anisotropy materials for the magnetically "fixed" layer and the magnetically "free" layer. The particular choices of materials utilized by the present invention can be synthesized with industry standard sputter deposition process and will not necessarily require elaborate thin film processing such as molecular epitaxy, making the process readily adaptable to existing manufacturing environment.

An important idea of the present invention is to combine two different types of magnetic thin films with perpendicular magnetic anisotropy in a magnetic junction (e.g., a single magnetic tunnel junction). The combination thus created satisfies the requirement for an efficient spin-current switchable device, and at the same time makes the device easy to manufacture.

One type of magnetic film with perpendicular anisotropy is a cobalt film (e.g., an ultra-thin cobalt film) residing on a noble metal surface (e.g., PtCo or AuCo). The interface electronic structure is such that it gives the cobalt film a strong interface magnetic anisotropy that is perpendicular to the interface.

This class of films can be made with room temperature UHV sputter deposition. The resulting polycrystalline film with preferential (111) close-pack surface is sufficient to induce such interface anisotropy. This interface anisotropy, however, can only support a very thin layer of cobalt (e.g., usually less than about 15 Å to 30 Å in thickness) for it to have perpendicular magnetization alignment to the interface (e.g., surface). This type of magnetic thin film structure is good for use as the magnetically "free" layer, which should be thin and can be rotated by a spin-current injection.

However, the same type of layer (e.g., the same composition of layer), can not be used for the magnetic "free" layer and the magnetic "fixed" or reference, layer. The fixed layer (e.g., the reference layer) should have enough magnetic anisotropy to stay fixed during the entire current-induced switching process and thick enough to provide sufficient amount of spin-polarized current. That is why another type of magnetic film with perpendicular anisotropy should be used for the magnetic fixed layer.

The second type of magnetic film (e.g., the magnetic "fixed" layer) may include, for example, rare-earth/transition metal alloys, such as GdCo alloy or TbFeCo alloy. These are actually microscopic ferrimagnets, with relatively small total magnetic moment, and can be engineered to have perpendicular magnetic anisotropy in their amorphous or polycrystalline thin film form. Some of these thin films have long been used for perpendicular magneto-optical recording.

An advantage of using these materials (e.g., rare-earth/transition metal alloys) as the "fixed" layer is that these materials can be made relatively thick (e.g., about 100 Å or more or even several hundred angstroms or more), and still retain a perpendicular magnetic anisotropy. The fact that the materials can be made thick, in combination with the fact that they are made of rare-earth containing magnetic materials which is dynamically very lossy (and hence less susceptible to spin-current induced magnetic excitation or switching), make these materials (e.g., rare-earth/transition metal alloys) and ideal candidate for the "fixed" magnetic layer.

Moreover, the choice of this material set (e.g., rare-earth/transition metal alloys) makes it feasible to engineer junction stacks with both the fixed and the free magnetic layers with perpendicular magnetic anisotropy. It may also allow easy fabrication of a three-layer magnetic junction geometry, such as ||Fixed top |separator |free |separator |Fixed bottom ||. This could further reduce the amount of switching current required to switch a junction device, and to increase the junction impedance.

One exemplary aspect of the present invention uses the following combination of thin film materials:

Pt(or Au)|Co|Oxide Barrier (e.g., MgO)|Co$_x$Fe$_{1-x}$|TbFeCo|Pt||

That is, in this exemplary aspect, a layer of Co is formed on a layer of Pt (or Au), an oxide barrier is formed on the layer of Co, and so forth. In this case, for example, the thickness of the Pt (or Au) layer may be at least about 50 Å, the thickness of the Co layer may be in a range from about 10-30 Å, the oxide barrier may be in a range from about 5-30 Å, the thickness of the Co$_x$Fe$_{1-x}$ layer (e.g., Co$_{80}$Fe$_{20}$) may be in a range from about 5-30 Å, the thickness of the TbFeCo layer may be in a range from about 100-500 Å and the thickness of the Pt layer may be in a range from about 50-500 Å.

On the left side of the tunnel barrier, the interface of PtCo may be used for interface perpendicular magnetic anisotropy. Dieny's group has shown this can be done with PtCo system in (e.g., see Monso et al, Appl. Phys. Left. 80, 4157 (2002)). Thereby, a free-layer with perpendicular magnetic axis and switchable by spin-current can be created, and with switching current density at or below $10^6$ A/cm$^2$.

On the right side of the tunnel barrier, the TbFeCo film may be used to create the magnetically "fixed" layer with perpendicular anisotropy. The 15 Å of CoFe at the interface may be used to increase tunnel magnetoresistance (MR). The CoFe|TbFeCo system has been shown to function as a magnetic tunnel electrode at the same time preserving its perpendicular magnetic orientation by Nishimura et al. JAP 91, 5246 (2002).

Using a similar concept, one may stack the layer sequences, and create a three-magnetic-layer structure, such as:

||TbFeCo|Co$_x$Fe$_{1-x}$|Tunnel Barrier (e.g., MgO) |Co|Au|Co$_x$Fe$_{1-x}$|TbFeCo|Pt||, where the first separation layer is a tunnel barrier, and the second is a spin-valve structure. The tunnel barrier provides large magneto-resistance and hence large voltage signal for read-out, while the spin-valve structure can further provide enhanced spin-polarization for the current.

That is, in this exemplary aspect, a layer of Co$_x$Fe$_{1-x}$ is formed on a layer of TbFeCo, a tunnel barrier is formed on the layer of Co$_x$Fe$_{1-x}$, and so forth. In this case, for example, the thickness of the first TbFeCo layer may be in a range from about 100-500 Å, the thickness of the first Co$_x$Fe$_{1-x}$ (e.g., Co$_{80}$Fe$_{20}$) layer may be in a range from about 5-30 Å, the thickness of the tunnel barrier may be in a range from about 5-30 Å, the thickness of the Co layer may be in a range from about 10-30 Å, the thickness of the Au layer may be in a range from about 10-200 Å, the thickness of the second Co$_x$Fe$_{1-x}$ layer may be in a range from about 5-30 Å, the thickness of the second TbFeCo layer may be in a range from about 100-500 Å and the thickness of the Pt layer is not necessarily limited (e.g., may be a part of a lead) but may be about 50-500 Å.

An alternative stack may include, for example:

||TbFeCo|Co$_x$Fe$_{1-x}$|Tunnel Barrier (e.g., MgO) |Co|Au|Tunnel Barrier (e.g., MgO)|TbFeCo|Pt||

That is, in this exemplary aspect, a layer of Co$_x$Fe$_{1-x}$ is formed on a layer of TbFeCo, a tunnel barrier is formed on the layer of Co$_x$Fe$_{1-x}$, and so forth. In this case, for example, the thickness of the first TbFeCo layer may be in a range from about 100-500 Å, the thickness of the first Co$_x$Fe$_{1-x}$ (e.g., Co$_{80}$Fe$_{20}$) layer may be in a range from about 5-30 Å, the thickness of the tunnel barrier may be in a range from about 10-30 Å, the thickness of the Co layer may be in a range from about 10-30 Å, the thickness of the Au layer may be in a range from about 0-200 Å, the thickness of the second tunnel barrier layer may be in a range from about 10-30 Å, the thickness of the second TbFeCo layer may be in a range from about 100-500 Å and the thickness of the Pt layer is not necessarily limited (e.g., may be a part of a lead) but may be about 50-500 Å.

In this case, the first (left-side) tunnel barrier may give magnetoresistance contrast for read-out, whereas the right side tunnel barrier may function primarily as a supplier of spin-polarized current and not necessarily provide much magnetoresistance (which could be advantageous in some magnetic arrangements to avoid the cancellation effect of magnetoresistance read-out).

Referring again to FIGS. 1A-1D, 2A-2B, 3A-3C and 4, the exemplary aspects of the present invention make use of a perpendicular component of magnetic anisotropy (e.g., a perpendicular magnetic anisotropy component) for the creation of a magnetic state that is more favorable for low-current switching. The perpendicular anisotropy component may counter the demagnetization field of a magnetic layer (e.g., the switching, or "free" layer, or the fixed, or "pinned" reference magnetic layers, or both) of the magnetic layers that form the thin film switching element), making the magnetic anisotropy which is useful for memory functions the only significant energy barrier that a spin-current switch has to overcome.

As illustrated in FIG. 1A, the barrier layer 125 may include a tunneling barrier layer which is formed between two magnetic layers 121, 122. That is, the inventive spin-current switchable magnetic memory element may include a magnetic tunneling junction.

As illustrated in FIG. 1B, the spin-current switchable magnetic memory element 100 may be formed on a substrate 110 (e.g., semiconductor substrate). Further, the spin-current switchable magnetic memory element 100 may include a first lead 130 (e.g., a bottom electrode), and a second lead 140 (e.g., top electrode).

Further, at least one of the plurality of magnetic layers 121, 122 may be included as part of a pillar (e.g., a thin film stack having lateral dimensions on the order of 100 nm) 150 formed between the first and second leads 130, 140. The pillar may have, for example, an oblong cross-section, but the pillar may have a cross-section of other shapes and is not necessarily limited to any particular cross-section.

Figure 1D:
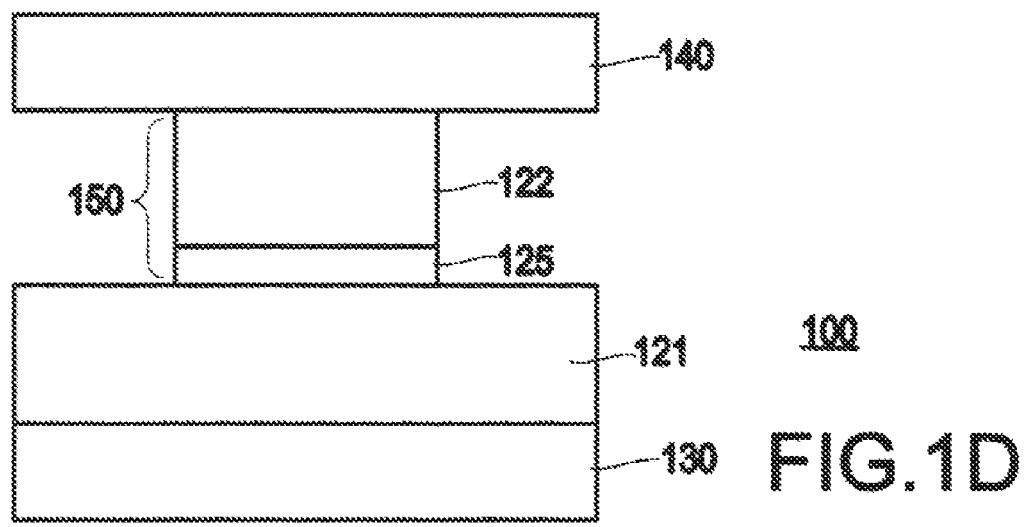

For example, as illustrated in FIG. 1C, all of the magnetic layers 121, 122 may be included in the pillar 150. However, some (e.g., all but one) of the plurality of magnetic layers may be formed outside of the pillar. For example, as shown in FIG. 1D, magnetic layer 122 is formed in the pillar 150, but magnetic layer 121 is not formed in the pillar. Further, a magnetic layer not included in the pillar 150 may be formed as part of the first or second leads 130, 140. It should also be noted that the barrier layer 125 may or may not be formed in the pillar.

In one exemplary aspect (e.g., illustrated in FIG. 1B), the first lead (e.g., bottom contact electrode) 130 may be formed between the substrate 110 and the pillar 150, and the second lead 140 (e.g., top contact electrode) may be formed on a top surface of the plurality of layers and opposite to the bottom contact electrode. The space between bottom lead (element 130) and top lead (element 140) can be filled with an insulating material (e.g., silicon dioxide). An electrical current (e.g., a current having a density of no more than about $10^6$ A/cm$^2$) flowing between the first and second leads 130, 140 via pillar 150 may cause a change in the magnetic moment (e.g., magnetization direction) of one of the plurality of magnetic layers (e.g., magnetic layer 122 in FIGS. 1B-1D).

An important concept of the present invention is to utilize the perpendicular magnetic anisotropy component observed in some magnetic thin films to counter-balance the strong demagnetization effect $4\pi M_s$, thus removing the main barrier for current-induced magnetic reversal, and reduce the switching current threshold.

A quantitative relationship may be established, both theoretically and with some recent experimental verification, that a threshold current for spin-current induced switching can be expressed as follows (when $4\pi M_s \geq H_p$):

$$I_c = (1/\eta)(2e/\hbar)\alpha(a^2 l_m M_s)[H_k + H_a + (4\pi M_s - H_p)/2]$$

where $\eta$ is the spin-polarization factor of the current, e is electron charge, $\hbar = h/2\pi$ is the normalized Planck constant, $\alpha$ is the magnetic damping coefficient, $l_m$ is the film thickness for the switching element layer, $a^2$ is the film area (e.g., lateral size squared), $M_s$ is the saturation magnetization of the switching element layer, $H_k$ is the uniaxial anisotropy field of the switching element layer in the film plane, and Hp is the perpendicular anisotropy field of the switching element layer induced either at the interface (such as for the case of Co—Pt interface) or through epitaxy with its strain field or intrinsic crystalline anisotropy of the material.

In addition, the term $(a^2 l_m M_s)(H_k)$ represents the uniaxial anistropy energy of the switching element (e.g., for a blocking temperature $T_b$, which reflects the thermal-stability limit for information storage), $4\pi M_s$ is the easy-plane shape anistropy and $H_a$ is the applied field. Further explanation for material perpendicular anisotropy field $H_p$ is given below.

When $H_p$ is larger than $4\pi M_s$, the magnetic moment prefers to orient itself perpendicular to the surface of the film, and the difference $H_p - 4\pi M_s$ becomes a uniaxial anisotropy term as well. If the additional uniaxial anisotropy $H_k$ is also designed to be perpendicular, one has the ideal situation of $$I_c = (1/\eta)(2e/\hbar)\alpha(a^2 l_m M_s)[(H_k + (H_p - 4\pi M_s)/2) + H_a]$$

where all terms of anisotropy energy are uniaxial that contributes to the nanomagnet's thermal stability. In this case one wastes no current on overcoming any easy-plane anisotropy which does not contribute to thermal stability.

To implement such a perpendicular magnetic moment arrangement, one has to not only have the "free" layer nanomagnet's magnetic moment become perpendicular, it is also necessary for the "fixed" or "reference" magnetic layer to have magnetic moment perpendicular to the film surface. This requires the engineering of relatively thick magnetic films to have perpendicular magnetic anisotropy. This requirement can be satisfied by using the rare-earth-transition metal alloy systems such as GdFeCo prepared using sputter deposition.

For most magnetic thin films of interest for magnetic memory applications, the demagnetization term $4\pi M_s$ would be large compared to $H_k$. For cobalt, for example, the term is on the order of 16,000 Oe, whereas $H_k$ is usually less than 1,000 Oe. Ordinarily, the $4\pi M_s$ term is the main factor in controlling the switching current. The demagnetization energy is an easy-plane anisotropy, which is a consequence of the flat geometry of a thin film nanomagnet.

The exemplary aspects of the present invention use the additional materials and/or interface perpendicular magnetic anisotropy energy (whose effect is represented by $H_p$ in the above formula), as a means to counter this force. Specifically, the present invention may reduce the combined perpendicular anisotropy to a value (e.g., a minimum value) that is convenient for a spin-current induced switch.

Specifically, the exemplary aspects of the present invention may utilize two classes of possible mechanisms for perpendicular magnetic anisotropy. One class originates from interface electronic interaction, the other class from bulk structural (e.g., strain) modulation in the plurality of magnetic layers (e.g., strain in a thin film nanomagnet).

A specific example belonging to the first class of mechanisms is the interface-induced perpendicular magnetic anisotropy in thin films (e.g., cobalt-gold films). It has been demonstrated experimentally that ultra-thin Pt/Co/Pt and Au/Co/Au films exhibit perpendicular anisotropy large enough to completely overcome the thin film demagnetization field of cobalt. It has been further demonstrated experimentally that one can place two layers of such materials adjacent to each other with different perpendicular switching field strength.

Thus, referring again to FIGS. 1A-1D, the spin-current switchable magnetic memory element may include two magnetic layers 121, 122 separated by a barrier layer 125. An important aspect of the present invention is that at least one of the magnetic layers (e.g., magnetic layer 121) includes an alloy of a rare-earth metal and a transition metal, (e.g., magnetic layer 122).

Thus, for example, magnetic layer 121 may be free magnetic layer and include, for example, a cobalt layer formed on gold or platinum. Magnetic layer 122, on the other hand, may be a fixed magnetic layer and include, for example, an alloy of a rare-earth metal and a transition metal (e.g., a GdCo alloy, TbFeCo alloy, etc.). Further, the barrier layer (e.g., tunneling barrier) 125 may include, for example, aluminum oxide or magnesium oxide.

As illustrated in FIGS. 1B-1F, the barrier layer 125 and at least one of the magnetic layers 121, 122 may be included in the lithographed pillar 150 (e.g., an elongated cylinder-shaped pillar having a lateral size less than about 100 nm). The magnetization (e.g., magnetic moment) of one magnetic layer (e.g., layer 122) may have a fixed orientation, whereas another magnetic layer (e.g., layer 121) may have a switchable magnetization the direction which represents the information state.

In particular, a perpendicular magnetic anistropy may be included in the magnetic layer 122 which may have a magnitude sufficient to offset the easy-plane demagnetization effect $4\pi M_s$ in magnetic layer 122. This helps to reduce the amount of current needed to change the magnetization direction of the magnetic layer 122. Further, incorporation of the barrier layer (e.g., tunneling barrier layer) 125 adjacent to magnetic layer 122 suitable for spin-transfer switching helps to provide a practical signal voltage swing corresponding to the two different magnetic alignment states the adjacent magnetic layers have (e.g. parallel and antiparallel).

The magnetic layers of the spin-current switchable magnetic memory element may include a magnetic layer formed on a non-magnetic metal layer (e.g., cobalt on gold, cobalt on platinum, etc.). In this case, a perpendicular magnetic anisotropy component may be provided at an interface between layers (e.g., between a magnetic layer and a non-magnetic layer) in the magnetic layer.

Figure 2A:
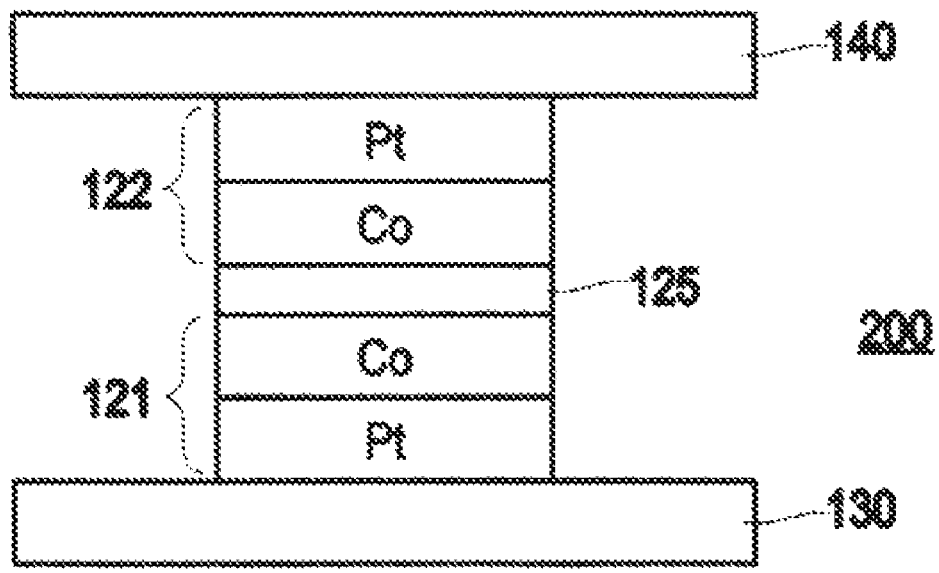
FIGS. 2A-2B illustrate a spin-current switchable magnetic memory element 200, in accordance with an exemplary aspect of the present invention.

For example, FIG. 2A illustrates a magnetic memory element 200 having first and second leads 130, 140, and a first magnetic layer 121 including a layer of cobalt formed on a layer of platinum, a barrier layer (e.g., tunneling barrier layer) 125 formed on the first magnetic layer 121, and a second magnetic layer 122 including an alloy of a rare-earth metal and a transition metal (e.g., a GdCo alloy, TbFeCo alloy, etc.) which is formed on the barrier layer 125.

Figure 2B:
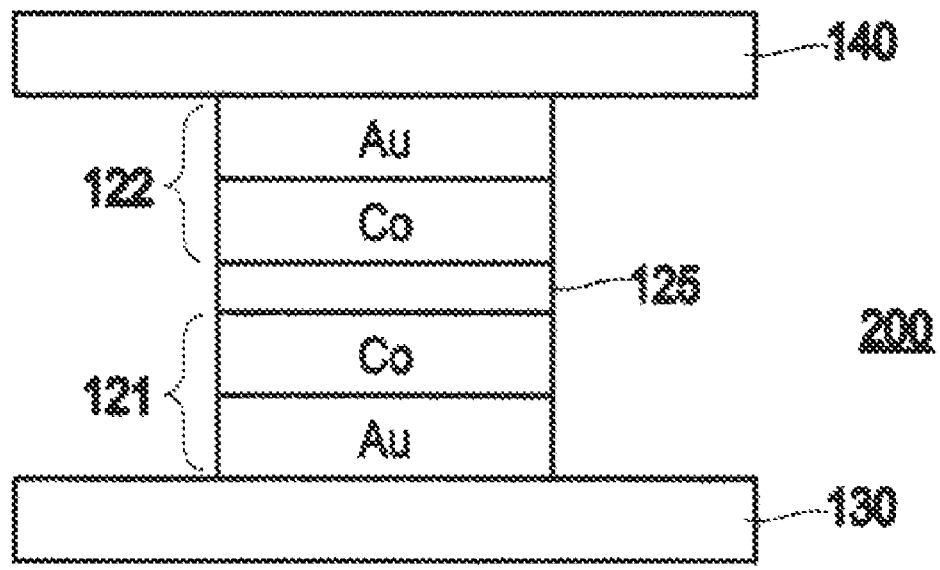

FIG. 2B illustrates another aspect in which the magnetic memory element 200 having first and second leads 130, 140, and a first magnetic layer 121 including a layer of cobalt formed on a layer of gold, a barrier layer (e.g., tunneling barrier layer) 125 formed on the first magnetic layer 121, and a second magnetic layer 122 including an alloy of a rare-earth metal and a transition metal (e.g., a GdCo alloy, TbFeCo alloy, etc.) which is formed on the barrier layer 125.

Further, as illustrated in FIGS. 1A-1D, the magnetic layers 121, 122 may be included as part of the pillar 150 or lead 130, 140.

Although the exemplary aspects illustrated in FIGS. 1A-1D and 2A-2B illustrate a memory element having two magnetic layers 121, 122, it is possible for the memory element of the present invention to include any number of magnetic layers 121 (e.g., free magnetic layers) and magnetic layers 122 (e.g., fixed magnetic layers)

Figure 3A:
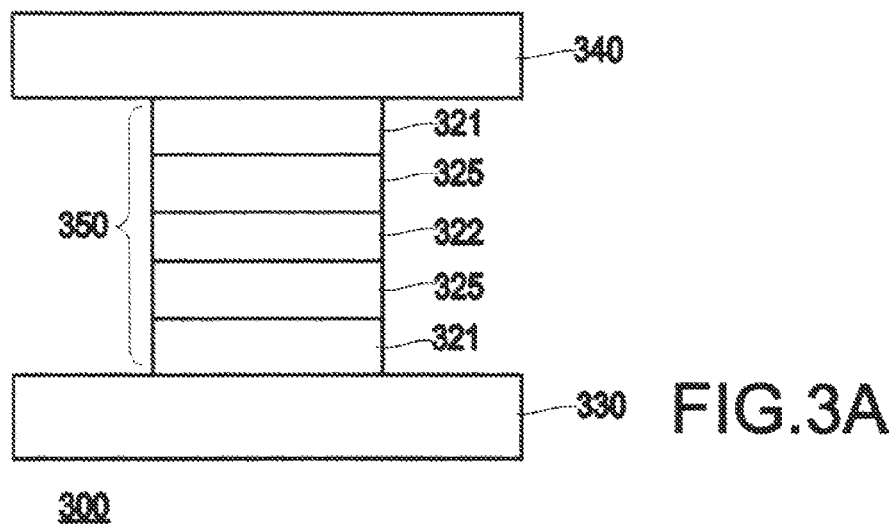
FIGS. 3A-3C a spin-current switchable magnetic memory element 300, according to an exemplary aspect of the present invention.

For example, as illustrated in FIG. 3A, the memory element may include a first and second leads 330, 340, and a pillar 350 which includes magnetic layers 321 formed adjacent to the leads 330, 340, barrier layers 325 formed adjacent to the magnetic layers 321, and a second magnetic layer 322 formed between the barrier layers 325.

Figure 3B:
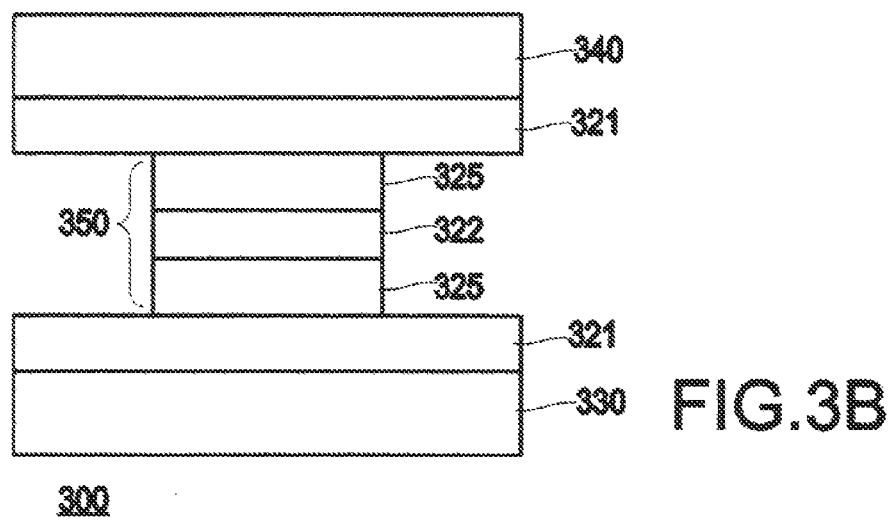

FIG. 3B illustrates a magnetic memory element which is similar to that in FIG. 3A. However, the magnetic memory element of FIG. 3B does not include the magnetic layers 321 as part of the pillar 350. Instead, the magnetic layers 321 are formed as part of the first and second leads 330, 340.

Figure 3C:
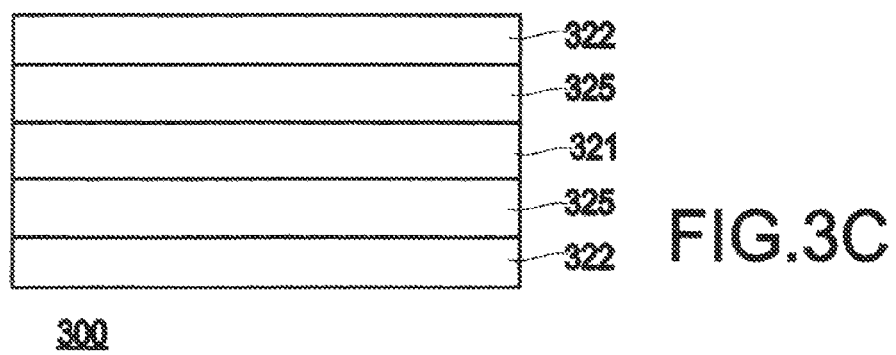

FIG. 3C illustrates another exemplary aspect of the present invention. Specifically, the memory element 300 may include a fixed bottom magnetic layer 322, a separator layer (e.g., a tunneling barrier layer) 325 formed on layer 322, a free magnetic layer 321, another separator layer (e.g., tunneling barrier layer) 325, and a fixed top magnetic layer 322.

It should be noted that in any of the exemplary aspects of the present invention (e.g., FIGS. 3A-3C), the barrier layers and magnetic layers may include different materials. Thus, for example, one of the barrier layers 325 in FIG. 3A may include aluminum oxide, whereas another one of the layers 325 may include magnesium oxide. Further, one of the magnetic layers 321 may include a Co layer formed on gold, whereas another one of the magnetic layers 321 may include a Co layer formed on platinum. Further, one of the magnetic layers 322 may include a GdCo alloy, whereas another one of the magnetic layers 322 may include a TbFeCo alloy, and so on.

In all exemplary structures discussed above, the perpendicular anisotropy component introduced through either interface or bulk strain can, but does not need to, completely overcome the shape-anisotropy-induced easy-plane magnetic anisotropy. That is, $H_p$ needs to be close to but does not have to exceed, $4\pi M_s$. When $H_p > 4\pi M_s$, the nanomagnet layer responsible for switching (e.g., the "free" layer) will have its stable magnetization direction perpendicular to the thin film surface, either pointing up or down, representing the 0 and 1 state of information.

In this case, the fixed, or reference layers of magnetic thin film(s) should be engineered to have its (their) magnetization resting in the perpendicular direction as well so as to provide the correct reference direction, both for writing and for reading the magnetic bit. This geometry may have superior magnetic stability over arrangements where the thin film magnetization stays within the thin film plane.

The inventors have previously pointed out that it is often non-trivial to engineer more than one magnetic thin film in the stack to have a perpendicular magnetic anisotropy component strong enough to overcome the demagnetization. This is particularly so if the perpendicular anisotropy component originates from a strained thin film state.

If such is the case, it may be simpler and easier to engineer the perpendicular anisotropy component in the "free" layer to be just below that of the demagnetization field $4\pi M_s$. That is, to have $Hp \lesssim 4\pi M_s$, so that $4\pi M_s - H_p \sim H_k$. This way, the "free" layer's magnetization will still rest within the thin film plane, but it will be allowed to rotate out of the thin film plane upon spin-current excitation.

Since the resting position of the "free" layer remains within the thin film plane, the reference magnetic layer also need only have its magnetization resting within the thin film plane. This way, one is able to avoid the difficult task of trying to engineer a structure where the fixed magnetic layer would also have to have its magnetization rest perpendicular to the film surface. This will significantly lower the complexity of device materials engineering.

With the newly disclosed materials combination incorporating the rare-earth-transition metal ferrimagnetic alloys such as GdFeCo or TbFeCo, it is possible to engineer the magnetic stack with all magnetic films having a true perpendicular magnetic state. This can now be accomplished because the thicker magnetic "reference" layer(s) can be prepared by using the ferrimagnetic alloys with sputter deposition. Under optimized deposition conditions these ferrimagnetic alloy thin films can be made with net-perpendicular magnetic anisotropy with film thicknesses well above 100 Å. Furthermore, these ferrimagnetic alloy thin films thus prepared have sufficient perpendicular magnetic anisotropy and strong enough interface exchange coupling with other ferromagnetic films such as $Co_xFe_{1-x}$ (with x ranging between 0 and 1) to force a perpendicular magnetic moment state in such ferromagnetic thin films (typically less than 30 Å or so) in direct contact with the ferrimagnet with an in-situ prepared interface. An example of such a structure is the |$Co_xFe_{1-x}$|TbFeCo| bilayer as discussed earlier, and as has been experimentally demonstrated by Nishimura's group (see Nishimura et al. J. Appl. Phys. 91, 5246 (2002)).

It is important to note that in any of the above-discussed aspects of the present invention (e.g., FIGS. 1A-3C), the incorporation of the tunneling barrier into the plurality of layers (e.g., pillar) suitable for spin-transfer switching helps to provide a practical signal voltage.

Furthermore, a two-terminal bi-stable magnetic switch with relatively high impedance and signal level is, from a circuit's perspective, very similar to other types of memory elements (e.g., ovonic unified memory (OUM) type, perovskite resistive memory, etc.) that are currently being developed. The present invention has all the advantages of speed and nonvolatility MRAM has to offer, and at the same time is compatible with the circuit architecture of the other types of two-terminal resistive-switching memories, making it a much a broad-based memory element technology for future generations of MRAM and for system integration.

As noted above, the fixed magnetic layer (e.g., an alloy of a rare-earth metal and a transition metal) may be formed to have a relatively large thickness (e.g., about 100 angstroms or more) compared to the thickness of the free magnetic layer (e.g., cobalt on gold, cobalt on platinum, etc.) (e.g., less than about 30 angstroms). By tuning the thicknesses and materials of the magnetic layers, the present invention is able to obtain different perpendicular anisotropy fields for the magnetic layers adjacent to the tunneling barrier layer (e.g., the top magnetic layer and the bottom magnetic layer). This can give a unique switching threshold current for the free magnetic layers to be switchable by current injection across the tunneling barrier layer, as well as for the fine-tuning of magnetic stability for the switching device.

Another exemplary aspect of the present invention includes a method of fabricating a spin-current switchable magnetic memory element. The method may include, for example, forming a plurality of magnetic layers having a perpendicular magnetic anisotropy component, at least one of the plurality of magnetic layers, at least one of the plurality of magnetic layers including an alloy of a rare-earth metal and a transition metal, s, and at least one barrier layer formed adjacent to at least one of the plurality of magnetic layers. The inventive method may include all of the features and functions described above with respect to the inventive spin-current switchable magnetic memory element.

Figure 4:
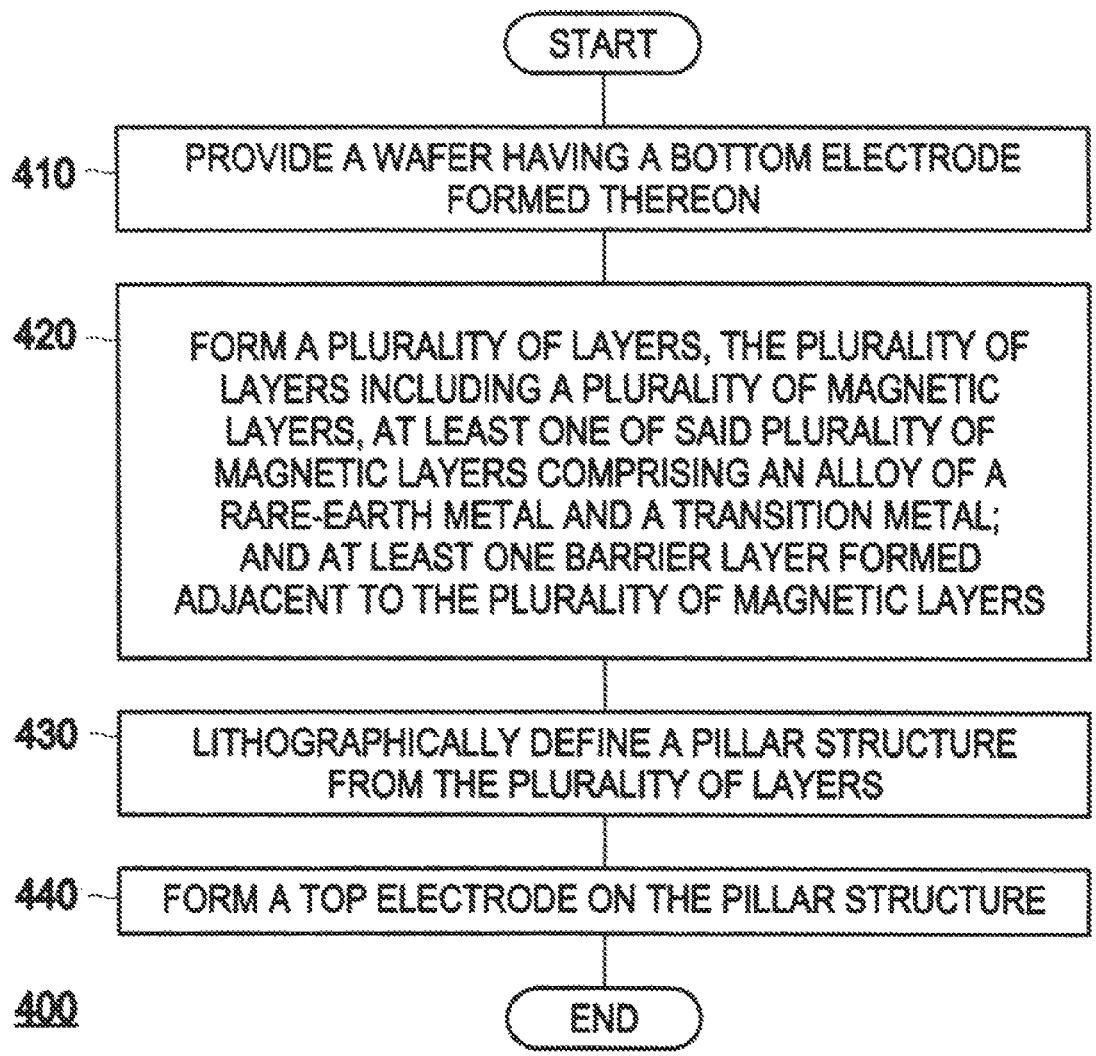
FIG. 4 illustrates a method 400 of fabricating a spin-current switchable magnetic memory element, according to an exemplary aspect of the present invention.

FIG. 4 illustrates an exemplary aspect of the method of fabricating a spin-current switchable magnetic memory element according to the exemplary aspects of the present invention. As illustrated in FIG. 4, the method 400 of fabricating a spin-current switchable magnetic memory element includes providing (410) a wafer having a bottom electrode formed thereon, forming (420) a plurality of layers, the plurality of layers including a plurality of magnetic layers, at least one of the plurality of magnetic layers, at least one of the plurality of magnetic layers including an alloy of a rare-earth metal and a transition metal, and at least one barrier layer formed adjacent to said plurality of magnetic layers, lithographically defining (430) a pillar structure from the plurality of layers, and forming (440) a top electrode on said pillar structure.

It should be noted that the barrier layer(s) may be formed during the formation of the plurality of magnetic layers. For example, the method may include forming a first magnetic layer, forming a barrier layer on the first magnetic layer, and forming a second magnetic layer on the barrier layer. Another barrier layer may then be formed on the second magnetic layer, and so on.

Further, it is important to note that the magnetic layers in the claimed invention (e.g., the at least one magnetic layer including an alloy of a rare-earth metal and a transition metal) may be formed by a sputter deposition process. That is, the materials (e.g., in the magnetic layers) in the present invention may be selected such that the method 400 does not require the use of sophisticated thin film synthesis technology such as molecular beam epitaxy.

With its unique and novel features, the present invention provides a magnetic memory element (e.g., a spin-current injection tunneling device) which includes materials that allow the memory element to be manufactured without necessarily requiring sophisticated thin film synthesis technology such as molecular beam epitaxy.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

It should be noted that the term "a plurality of layers having a perpendicular magnetic anisotropy component" should be broadly construed to mean that at least one layer in the plurality of layers has a component of perpendicular magnetic anisotropy. Further, the term "perpendicular magnetic anisotropy component" should be broadly construed to mean "at least some component" of perpendicular magnetic anisotropy. That is, a layer (e.g., a layer having a perpendicular magnetic anisotropy component) does not need to exhibit a total magnetic anisotropy that is perpendicular, but need only to have its shape-induced easy-plane anisotropy reduced (e.g., significantly reduced) by the said component of perpendicular anisotropy.

Further, the term "fixed" layer as used herein should be broadly construed to include a layer having a net perpendicular anisotropy (e.g., a layer having a magnetic moment resting in a position that is out of the plane of the film surface (e.g., perpendicular to the film surface)). The magnetic moment of the "fixed" layer does not need to be totally perpendicular for the present invention to work, but this feature is enabled by the present invention (e.g., by the particular combination of materials of the present invention), and is a significant feature of the present invention.

In addition, it should be noted that terms such as "an X layer" and "a layer of X" (e.g., where X is cobalt, gold, etc.) included herein may be construed to mean a layer including X. That is, for example, the term "a cobalt layer" and "a layer of cobalt" may be construed to mean a layer including cobalt.

Further, Applicant's intent is to encompass the equivalents of all claim elements, and no amendment to any claim the present application should be construed as a disclaimer of any interest in or right to an equivalent of any element or feature of the amended claim.

The invention claimed is:

1. A spin-current switchable magnetic memory element, comprising:
   a plurality of magnetic layers having a perpendicular magnetic anisotropy component, said plurality of magnetic layers comprising a first spin-current switchable magnetic layer comprising an alloy of a rare-earth metal and a transition metal, and a second spin-current polarization layer including a material which is different than said alloy; and
   a barrier layer formed adjacent to said plurality of magnetic layers.

2. The magnetic memory element according to claim 1, wherein said perpendicular magnetic anistropy component has a magnitude sufficient to at least substantially offset an easy-plane demagnetization effect.

3. The magnetic memory element according to claim 1, wherein a magnetic moment of said second spin-current polarization layer is one of resting out of the layer plane and rotatable out of the layer plane under spin current excitation.

4. The magnetic memory element according to claim 1, wherein said barrier layer is formed between said first spin-current switchable magnetic layer and second spin-current polarization layer.

5. The magnetic memory element according to claim 1, wherein said second spin-current polarization layer comprises a current-switchable magnetic moment.

6. The magnetic memory element according to claim 1, wherein at least one of said plurality of magnetic layers is formed by sputter deposition.

7. The magnetic memory element according to claim 1, wherein said second spin-current polarization layer comprises a cobalt layer formed on platinum.

8. The magnetic memory element according to claim 1, wherein said second spin-current polarization layer comprises a cobalt layer formed on gold.

9. The magnetic memory element according to claim 1, wherein said second spin-current polarization layer comprises a magnetically free layer which can be rotated by a spin-current injection.

10. The magnetic memory element according to claim 1, wherein said first spin-current switchable magnetic layer comprises a fixed magnetic layer having a sufficient thickness and a sufficient magnetic anisotropy to stay fixed during a current-induced switching process.

11. The magnetic memory element according to claim 10, wherein said fixed magnetic layer provides a sufficient amount of spin-polarized current for switching a magnetic moment of said second spin-current polarization layer.

12. The magnetic memory element according to claim 1, wherein said alloy comprises a GdCo alloy.

13. The magnetic memory element according to claim 1, wherein said alloy comprises a TbFeCo alloy.

14. The magnetic memory element according to claim 1, wherein said first spin-current switchable magnetic layer comprises a thickness of more than 100 Å and said second spin-current polarization layer comprises a thickness of less than about 30 Å.

15. The magnetic memory element according to claim 1, further comprising:
a first lead formed adjacent to one of said plurality of magnetic layers;
a second lead formed adjacent to another one of said plurality of magnetic layers; and
a pillar formed between said first and second leads, said pillar including said barrier layer and at least one of said plurality of magnetic layers.

16. The magnetic memory element according to claim 14, wherein a magnetic moment of said at least one magnetic layer included in said pillar is switchable by an electrical current having a density of no more than about $10^6$ A/cm$^2$.

17. The magnetic memory element according to claim 14, wherein said barrier layer preserves spin information for an electric current injected into said pillar and provides a resistance to said current.

18. The magnetic memory element according to claim 14, wherein said pillar comprises a lithographed pillar having a diameter of less than about 100 nm.

19. The magnetic memory element according to claim 1, wherein said second spin-current polarization layer comprises a cobalt layer having a thickness of less than about 30 Å.

20. A method of fabricating a magnetic memory element, said method comprising:
forming a plurality of magnetic layers having a perpendicular magnetic anisotropy component, said plurality of magnetic layers comprising a first spin-current switchable magnetic layer comprising an alloy of a rare-earth metal and a transition metal, and a second spin-current polarization layer including a material which is different than said alloy; and
forming a barrier layer adjacent to said plurality of magnetic layers.

21. The method of fabricating a magnetic memory element according to claim 19, wherein said perpendicular magnetic anistropy component has a magnitude sufficient to at least substantially offset an easy-plane demagnetization effect.

* * * * *